(12) United States Patent
Hsieh

(10) Patent No.: US 9,297,695 B2
(45) Date of Patent: Mar. 29, 2016

(54) MOTION SENSING DEVICE AND PACKAGING METHOD THEREOF

(71) Applicant: LITE-ON SEMICONDUCTOR CORPORATION, New Taipei (TW)

(72) Inventor: Ming-Hsun Hsieh, Kaohsiung (TW)

(73) Assignee: Dyna Image Corporation, Hsin-Tien Dist. New Taipei (TW)

(*) Notice: Subject to any disclaimer, the term of this patent is extended or adjusted under 35 U.S.C. 154(b) by 0 days.

(21) Appl. No.: 14/262,819

(22) Filed: Apr. 28, 2014

(65) Prior Publication Data

US 2014/0319348 A1    Oct. 30, 2014

Related U.S. Application Data

(60) Provisional application No. 61/817,306, filed on Apr. 29, 2013.

(30) Foreign Application Priority Data

Dec. 26, 2013  (CN) .......................... 2013 1 0731621

(51) Int. Cl.
*G01J 1/42*  (2006.01)
*H01L 25/00*  (2006.01)
*H01L 25/16*  (2006.01)
*H05K 13/04*  (2006.01)
(Continued)

(52) U.S. Cl.
CPC ................. *G01J 1/42* (2013.01); *G01S 7/4813* (2013.01); *G01S 17/50* (2013.01); *G06F 3/0304* (2013.01); *G06F 3/0354* (2013.01); *G06F 3/03547* (2013.01); *G06F 13/24* (2013.01); *G06K 9/60* (2013.01); *G06T 5/008* (2013.01); *H01L 25/167* (2013.01); *H01L 25/50* (2013.01); *H01L 31/02327* (2013.01); *H05K 13/046* (2013.01); *G01J 2001/4295* (2013.01); *H01L 27/14618* (2013.01); *H01L 27/14625* (2013.01); *H01L 2224/05554* (2013.01); *H01L 2224/48091* (2013.01); *H01L 2224/48247* (2013.01)

(58) Field of Classification Search
CPC .................. H01L 222/48091; H01L 27/14618
See application file for complete search history.

(56) References Cited

U.S. PATENT DOCUMENTS 4,866,571 A      9/1989  Butt
5,317,149 A  *   5/1994  Uebbing ............ G01D 5/34715
                                                    250/216

(Continued)

FOREIGN PATENT DOCUMENTS

DE          2146 377          3/1973
DE   10 2007 023 893 A1      11/2008

OTHER PUBLICATIONS

SFH 7773 (IR-LED + Proximity Sensor + Ambient Light Sensor), Application note, preliminary, Dec. 12, 2011, pp. 1-23, Opto Semiconductors, OSRAM, XP055111379.

*Primary Examiner* — Christine Sung
(74) *Attorney, Agent, or Firm* — Winston Hsu; Scott Margo

(57) ABSTRACT

A motion sensing device for sensing infrared rays, the motion sensing device includes a substrate; a sensing unit, configured on the substrate for sensing the infrared rays; a stabilizing layer, covering on the sensing unit for fixing and protecting the sensing unit, wherein the stabilizing layer has an opening; a protection layer, formed on the opening; and a coating layer, covering the stabilizing layer for absorbing infrared rays, wherein the coating layer does not cover the opening.

6 Claims, 3 Drawing Sheets

(51) Int. Cl.
*H01L 31/0232* (2014.01)
*G06F 3/0354* (2013.01)
*G06K 9/60* (2006.01)
*G06T 5/00* (2006.01)
*G06F 13/24* (2006.01)
*G01S 7/481* (2006.01)
*G01S 17/50* (2006.01)
*G06F 3/03* (2006.01)
*H01L 27/146* (2006.01)

(56) References Cited

U.S. PATENT DOCUMENTS

| | | | |
|---|---|---|---|
| 7,046,344 B2 | 5/2006 | Yamamoto | |
| 7,309,855 B2* | 12/2007 | Nagasaka et al. | 250/231.14 |
| 7,617,980 B2* | 11/2009 | Saxena | G06K 7/10732 235/439 |
| 7,763,841 B1 | 7/2010 | McEldowney | |
| 7,842,957 B2* | 11/2010 | Goh | H04B 10/40 250/221 |
| 8,304,850 B2 | 11/2012 | Lazarov | |
| 8,604,436 B1* | 12/2013 | Patel et al. | 250/338.1 |
| 8,619,267 B2* | 12/2013 | Wong | H03K 17/943 356/615 |
| 2006/0237540 A1* | 10/2006 | Saxena et al. | 235/454 |
| 2008/0012085 A1* | 1/2008 | Cheng et al. | 257/433 |
| 2008/0122803 A1 | 5/2008 | Izadi | |
| 2009/0034081 A1 | 2/2009 | Chu | |
| 2009/0045498 A1* | 2/2009 | Braden et al. | 257/687 |
| 2009/0256931 A1 | 10/2009 | Lee | |
| 2010/0171027 A1 | 7/2010 | Yun | |
| 2010/0181578 A1* | 7/2010 | Li et al. | 257/82 |
| 2011/0057102 A1* | 3/2011 | Yao | G01S 7/4813 250/338.1 |
| 2011/0068270 A1 | 3/2011 | Shin | |
| 2011/0204209 A1* | 8/2011 | Barrows | 250/208.1 |
| 2011/0204233 A1* | 8/2011 | Costello | G01S 7/4813 250/338.4 |
| 2011/0248172 A1 | 10/2011 | Rueger | |
| 2011/0254864 A1 | 10/2011 | Tsuchikawa | |
| 2011/0260176 A1 | 10/2011 | Onoe | |
| 2012/0080764 A1* | 4/2012 | Xue | 257/417 |
| 2012/0262421 A1 | 10/2012 | Kao | |
| 2012/0265471 A1 | 10/2012 | Hess | |
| 2013/0044380 A1 | 2/2013 | Shen | |
| 2013/0093708 A1 | 4/2013 | Annett | |
| 2013/0341650 A1* | 12/2013 | Peng | 257/82 |
| 2014/0118257 A1 | 5/2014 | Baldwin | |
| 2014/0361200 A1 | 12/2014 | Rudmann | |
| 2015/0028360 A1* | 1/2015 | Tu et al. | 257/82 |

\* cited by examiner

Top View

Cross-section view

MOTION SENSING DEVICE AND PACKAGING METHOD THEREOF

CROSS REFERENCE TO RELATED APPLICATIONS

This application claims the benefit of U.S. Provisional Application No. 61/817,306 filed on Apr. 29, 2013 and entitled "3D-Motion Gesture/Proximity Detection Module Sensor (MGPS)", the contents of which are incorporated herein.

BACKGROUND OF THE INVENTION

1. Field of the Invention

The present invention relates to a motion sensing device packaging method thereof, and more particularly, to a motion sensing device sensing movements and motions of an object by detecting infrared ray and packaging method thereof.

2. Description of the Prior Art

With the scientific and technological advancement, computer systems are viewed as necessities for ordinary people in their daily lives, from traditional functions, such as word processing and program executing, to modern multimedia processing, and computer games, etc. Thus, technology of the input apparatus also has improved.

A pointing device is utilized for transforming motions of a user into signals via a motion sensor capable of sensing a motion trace for an electronic device having computing capacity, so as to control the movement of graphical cursers or pointers on display screens, to select objects on display screens with a graphical user interface, and to perform control functions displayed on the screen, allowing the user direct interaction with the computer system. Thus, how to realize the motion sensor with high accuracy becomes a topic to be discussed.

SUMMARY OF THE INVENTION

In order to solve the above problem, the present invention provides a motion sensing device sensing movements and motions of an object by detecting infrared ray and packaging method thereof.

The present invention discloses a motion sensing device for sensing infrared rays, the motion sensing device comprising a substrate; a sensing unit, configured on the substrate for sensing the infrared rays; a stabilizing layer, covering on the sensing unit for fixing and protecting the sensing unit, wherein the stabilizing layer has an opening; a protection layer, formed on the opening; and a coating layer, covering the stabilizing layer for absorbing infrared rays, wherein the coating layer does not cover the opening.

The present invention further discloses A packaging method for a motion sensing device, comprising configuring a sensing unit on a substrate; bonding the sensing unit and the substrate via a plurality of bonding wires; forming a stabilizing layer for covering the sensing unit; performing a half-cutting process for forming an opening on the stabilizing layer; injecting a material at the opening for forming a protection layer; and performing a coating process, for covering the stabilizing layer by a coating layer, wherein the coating layer does not cover the opening.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
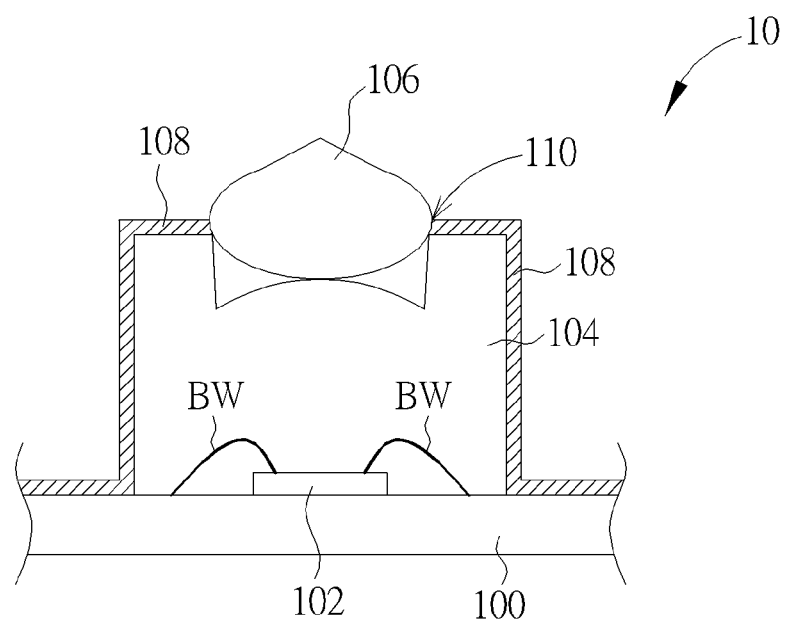
FIG. 1 is a schematic diagram of a motion sensing device according to an embodiment of the present invention.

Please refer to FIG. 1, which is a cross-section view of a motion sensing device 10 according to an embodiment of the present invention. The motion device 10 comprises a substrate 100, a sensing unit 102, a stabilizing layer 104, a protection layer 106 and a coating layer 108. The sensing unit 100 is configured on the substrate 100 for receiving the infrared rays and accordingly detecting the moving trace of the external object. The stabilizing layer 104 covers on the sensing unit 102 for fixing and protecting the sensing unit 102. Besides, the stabilizing layer 104 comprises an opening 10 for configuring the protection layer 106. The coating layer 108 covers the stabilizing layer 104 for preventing additional infrared rays from emitting into the sensing unit 102. Note that, the coating layer 108 does not cover the opening 110 (i.e. does not block the path of the light from the opening 110 to the sensing unit 102), for ensuring the motion sensing device 10 works normally. As a result, the motion sensing device 10 of this embodiment can senses the moving trace of the external object.

In details, the substrate 100 may be a printed circuit board (PCB) or a substrate formed by the lead frame, but is not limited herein. In FIG. 1, the sensing unit 102 is a chip bonded to the pads of the substrate 100 via a plurality of bonding wires for transmitting signals. Please note that, FIG. 1 only shows two bonding wires BW for illustrations. The material of the pads and the bonding wires of the substrate 100 is the conductive material such as the gold, the copper or the aluminum. The stabilizing layer 104 is formed on the top of the sensing unit 102, and the material of the stabilizing layer 104 is the transparent glue, such as a Silicone, an Epoxy, and an Ultraviolet light (UV) Curable Adhesive, which allows the infrared rays to pass through. Via a half cutting process, the opening 110 is formed on the top of the stabilizing layer 104. The protection layer 106 is configured on (e.g. injected to) the opening 110 of the stabilizing layer 104 and the material of the protection layer 106 is the transparent glue, such as the silicone, which allows the infrared rays to pass through.

Finally, since the operations of the sensing unit 102 senses the motions of the objects is achieved via detecting the infrared rays, the sensing unit 102 is sensitive to the variations of infrared rays in the surrounding environment. In such a condition, the coating layer 108 containing materials for blocking the infrared rays is used to cover the stabilizing layer 104, for blocking the infrared rays within a certain frequency range and preventing the sensing result of the sensing unit 102 from being effected. Please note that, the coating layer does not cover the protection layer 106 (i.e. the opening 110) for ensuring the path of the infrared rays emits to the sensing unit 102. Besides, the method of forming the coating layer 108 may be various. For example, the coating layer 108 may be formed on the outer side of the stabilizing layer 104 via a spin coating process. As a result, the sensing unit 102 can receive the infrared rays emitted from the opening 110, so as to sensing the moving trace of the external object. For example, the light reflected by the external objects is changed due to different positions and different shapes of the external object. The motion sensing device 10 acquires the moving trace of the object via sensing the infrared rays reflected by the external object. In addition, the motion sensing device 10 may further comprise an infrared ray emitting unit (not shown in FIG. 1), for emitting the infrared rays capable of being sensed by the sensing unit 102, and is not limited herein.

Noticeably, the present invention provides a motion sensing device realized by the simple process. According to different applications and design concepts, those with ordinary skill in the art may observe appropriate alternations and modifications. For example, the wavelength of the light received by the sensing unit 102 for performing the operations of sensing the moving traces and motions of the objects can be altered to different wavelength ranges, such as the wavelength ranges of the UV and the visible light. Note that, when the wavelength range of the light received by the sensing unit 102 changes, the wavelength range of the light shielded by the coating layer 108 needs to be accordingly altered for avoiding affecting the sensing result of the sensing unit 102.

Figure 2:
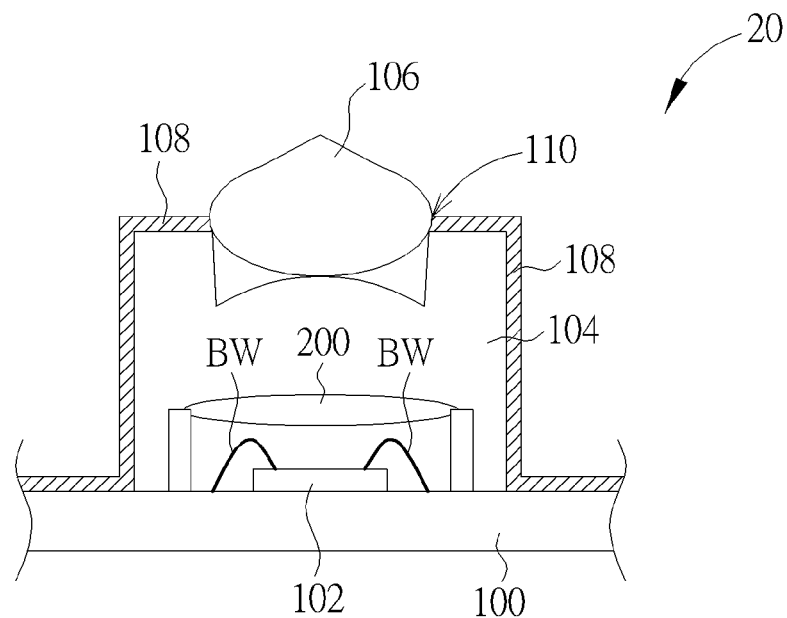
FIG. 2 is a schematic diagram of another motion sensing device according to an embodiment of the present invention.

Please refer to FIG. 2, which is a schematic diagram of a motion sensing device 20 according to an embodiment of the present invention. The motion sensing device 20 is similar to the motion sensing device 10 shown in FIG. 1, thus the components with similar functions use the same symbols. Different from the motion sensing device 10, the motion sensing device 20 adds a lens unit 200 at the top of the sensing unit 102. The lens unit 200 is utilized for focusing the light, to make the operations of the sensing unit 102 more efficient. According to different applications, the lens unit 200 can be lens component realized by different methods. For example, the lens unit 200 may be a wafer level lens, for reducing the manufacture cost by wafer level manufacturing technology.

Figure 3:
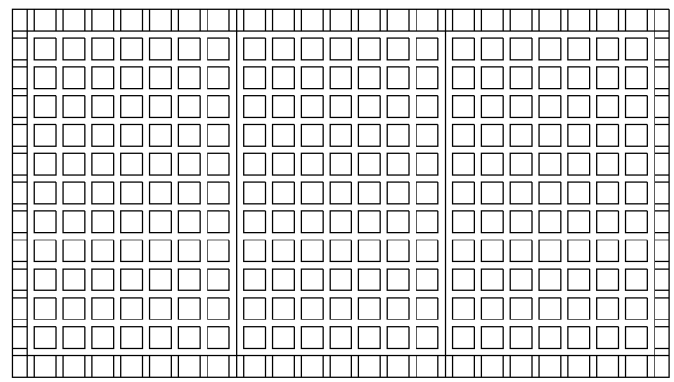
FIG. 3 is a schematic diagram of a plurality of motion sensing devices according to an embodiment of the present invention.
Figure 3:
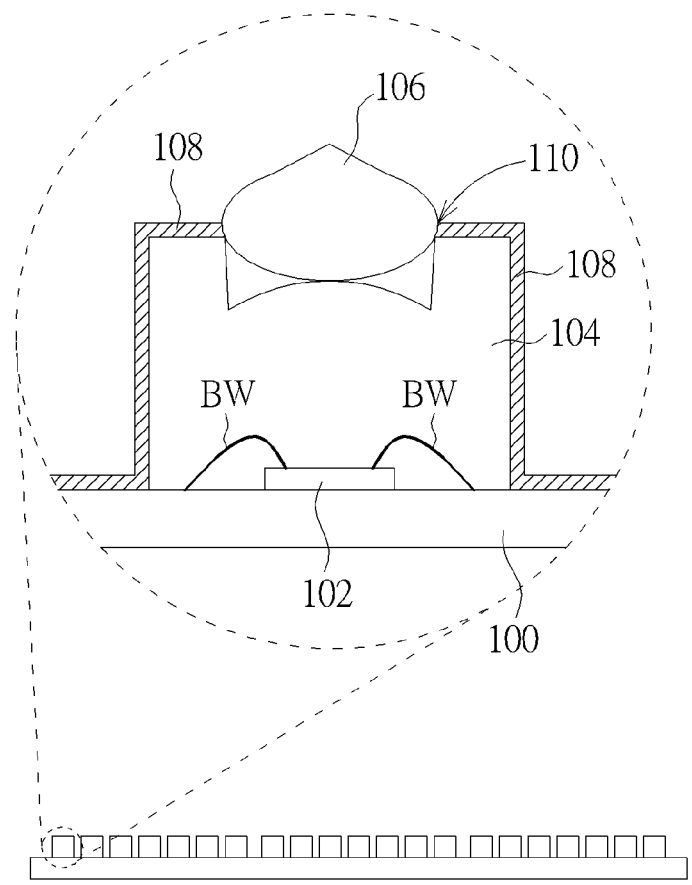

In the above embodiments, the single motion device is described for illustrating the structure and the packaging method. In general, when producing the packages of the motion sensing device, the entire packaging materials are configured layer by layer for generating multiple packages at the same time. Then, the multiple packages are sawed for acquiring multiple separate packages. Please refer to FIG. 3, which includes a top-view and a cross-section view of a plurality of motion sensing devices according to an embodiment of the present invention. According to different applications, the motion sensing device can be packaged by different packaging methods. For example, when packaging the motion sensing device, a sensing unit is configured on a substrate and bonded to the pads of the substrate via a plurality of bonding wires for forming the path of transmitting signals. Next, a stabilizing layer is formed on the sensing unit via performing the packing process. By performing the half-cutting process, the opening is formed on the top of the stabilizing layer. After the opening of the stabilizing layer is formed, the transparent glue (e.g. silicone) is injected to the opening for forming a protection layer at the opening. Finally, a coating layer is formed on the outer side of the stabilizing layer via performing the coating process (e.g. the spin-coating) Please note that, the coating layer does not cover the opening of the stabilizing layer. Via performing the above steps, the plurality of packages (i.e. motion sensing devices) shown in FIG. 3 can be acquired. In FIG. 3, each square is a package and single motion sensing device can be acquired after cutting.

Figure 4:
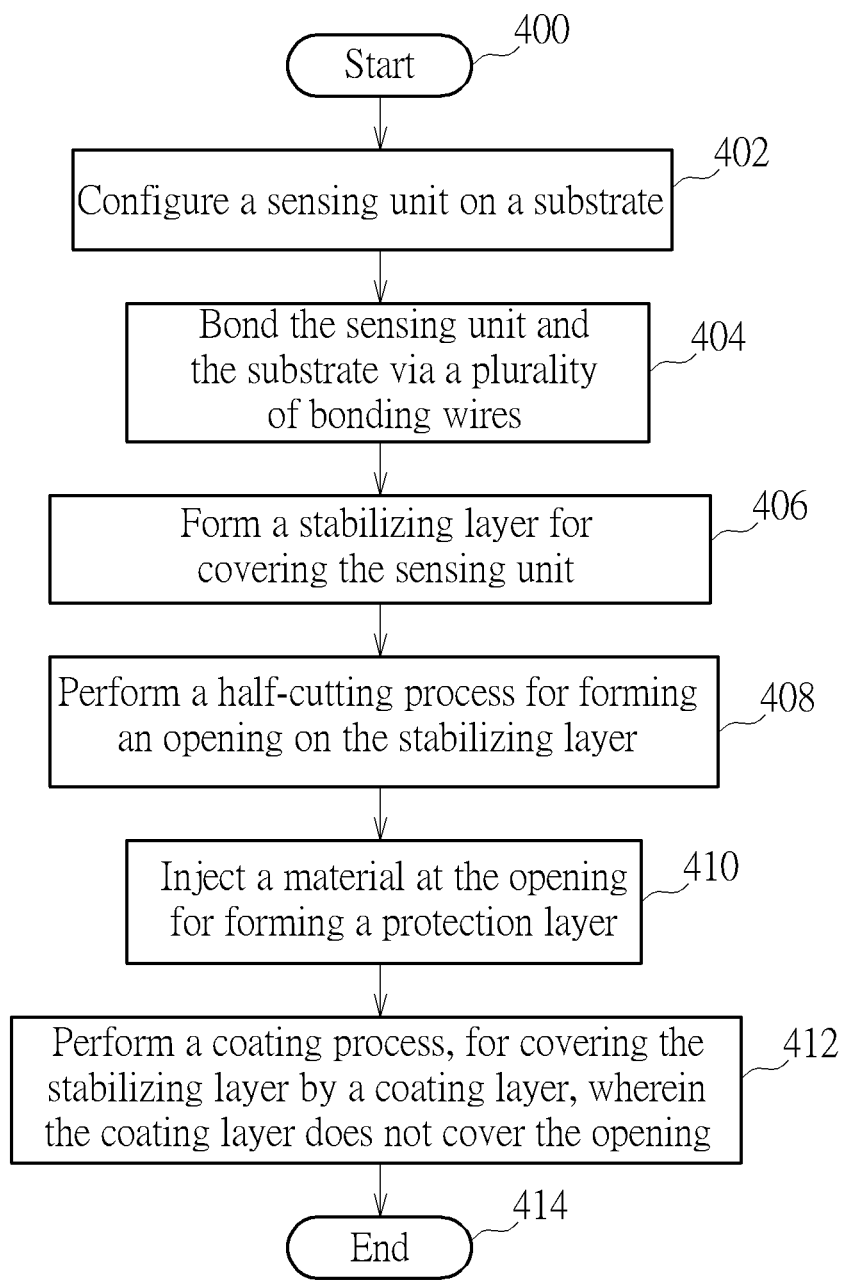
FIG. 4 is a flow chart of a process according to an embodiment of the present invention.

The method of packaging the motion sensing device can be summarized into a packing process 40, as shown in FIG. 4. The packaging process 40 comprises the following steps:

Step 400: Start.
Step 402: Configure a sensing unit on a substrate.
Step 404: Bond the sensing unit and the substrate via a plurality of bonding wires.
Step 406: Form a stabilizing layer for covering the sensing unit.
Step 408: Perform a half-cutting process for forming an opening on the stabilizing layer.
Step 410: Inject a material at the opening for forming a protection layer.
Step 412: Perform a coating process, for covering the stabilizing layer by a coating layer, wherein the coating layer does not cover the opening.
Step 414: End.

According to process 40, the plurality of motion sensing device shown in FIG. 3 can be acquired. After performing packaging cutting, the single motion sensing device can be acquired. The detailed operations of the process 40 can be referred to the above, and are not narrated herein for brevity.

To sum up, the packaging method of the above embodiments uses the simple process to realize the motion sensing device sensing the moving traces of the object via detecting the infrared rays. The present invention can realize the motion sensing device with high accuracy with low cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A motion sensing device for sensing infrared rays, the motion sensing device comprising:
   a substrate;
   a sensing unit, configured on the substrate for sensing the infrared rays;
   a lens unit, configured on top of the sensing unit;
   a stabilizing layer, covering on the sensing unit and the lens unit for fixing and protecting the sensing unit and the lens unit, wherein the stabilizing layer has an opening and is transparent;
   a protection layer, formed in the opening; and
   a coating layer, covering the stabilizing layer for absorbing infrared rays,
   wherein the coating layer does not cover the opening.

2. The motion sensing device of claim 1, wherein a material of the stabilizing layer includes one of Silicone, Epoxy and UV curable adhesive.

3. The motion sensing device of claim 1, wherein a material of the protection layer includes Silicone.

4. A packaging method for a motion sensing device, the packaging method comprising:
   configuring a sensing unit on a substrate;
   bonding the sensing unit and the substrate via a plurality of bonding wires;
   configuring a lens unit on top of the sensing unit;
   forming a stabilizing layer for covering the sensing unit and the lens unit, wherein the stabilizing layer is transparent;
   performing a half-cutting process for forming an opening on the stabilizing layer;
   injecting a material at the opening for forming a protection layer; and
   performing a coating process, for covering the stabilizing layer by a coating layer, wherein the coating layer does not cover the opening.

5. The packaging method of claim 4, wherein a material of the stabilizing layer includes one of Silicone, Epoxy and UV curable adhesive.

6. The packaging method of claim 4, wherein the material includes Silicone.

\* \* \* \* \*